US010451934B2

United States Patent
Furuta

(10) Patent No.: US 10,451,934 B2
(45) Date of Patent: Oct. 22, 2019

(54) METHOD OF INSTALLING ELECTRONIC COMPONENT, DISPLAY DEVICE AND DISPLAY SYSTEM

(71) Applicant: LG Display Co., Ltd., Seoul (KR)

(72) Inventor: Kaoru Furuta, Tokyo (JP)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/717,760

(22) Filed: Sep. 27, 2017

(65) Prior Publication Data
US 2018/0088388 A1 Mar. 29, 2018

(30) Foreign Application Priority Data
Sep. 28, 2016 (JP) ................. 2016-189587

(51) Int. Cl.
| H05K 1/18 | (2006.01) |
| G02F 1/1345 | (2006.01) |
| G02F 1/1333 | (2006.01) |
| H05K 3/34 | (2006.01) |

(52) U.S. Cl.
CPC ...... *G02F 1/13452* (2013.01); *G02F 1/13336* (2013.01); *H05K 1/189* (2013.01); *H05K 3/3463* (2013.01)

(58) Field of Classification Search
CPC .. G02F 1/13336; G02F 1/13452; H05K 1/189
See application file for complete search history.

(56) References Cited

U.S. PATENT DOCUMENTS

| 6,542,213 | B1* | 4/2003 | Uchiyama | ........... | G02F 1/13452 349/149 |
| 7,483,109 | B2* | 1/2009 | Ishibashi | ............. | G02F 1/13452 345/80 |
| 2012/0262886 | A1 | 10/2012 | Yamagishi | | |
| 2017/0005083 | A1* | 1/2017 | Choi | ................... | H01L 27/3276 |
| 2018/0088389 | A1* | 3/2018 | Furuta | ................ | G02F 1/13336 |

FOREIGN PATENT DOCUMENTS

| JP | 10-123557 A | 5/1998 |
| JP | 2004-260131 A | 9/2004 |
| JP | 3769688 B2 | 4/2006 |
| JP | 2007-128982 A | 5/2007 |
| JP | 2010-237405 A | 10/2010 |
| JP | 2012-226058 A | 11/2012 |

* cited by examiner

*Primary Examiner* — Hoa C Nguyen
*Assistant Examiner* — Keith DePew
(74) *Attorney, Agent, or Firm* — Seed IP Law Group LLP

(57) ABSTRACT

A display device, a display system, and a method of installing an electronic component are disclosed. In one embodiment, the electronic component is junctioned to a display panel of the display device using an auto-agglutination solder. The installation method includes positioning the electronic component having an electronic component side line connection part at a substrate stack that includes two substrates, a line between the two substrates, and a substrate side line connection part at an end of the line; forming an auto-agglutination solder between the electronic component side line connection part and the substrate side line connection part; and pressurizing the electronic component side line connection part and the substrate side line connection part by heating-up the auto-agglutination solder.

12 Claims, 12 Drawing Sheets

METHOD OF INSTALLING ELECTRONIC COMPONENT, DISPLAY DEVICE AND DISPLAY SYSTEM

CROSS-REFERENCE TO RELATED APPLICATION

The present application claims the benefit of Japanese Patent Application No. 2016-189587 filed in Japan on Sep. 28, 2016, which is herein incorporated by reference.

BACKGROUND

Technical Field

The present disclosure relates to a display device, a display system, and a method of installing or mounting an electronic component.

Description of the Related Art

Generally, the electronic component for the electronic device is installed on a surface of a substrate by joining a pad part of the electronic component to a line pattern on the substrate.

For example, Japanese Patent Publication No. 2012-226058 discloses a connection method of the line pattern of the substrate and a line connection part of the electronic component by using an anisotropic conductive film (ACF). The anisotropic conductive film includes a conductive particle dispersed in a thermosetting resin (thermohardening resin or thermally-curable resin). The line pattern of the substrate and the line connection part of the electronic component are electrically connected by the anisotropic conductive film.

In prior systems and methods that use anisotropic conductive film, such as disclosed in Japanese Patent Publication No. 2012-226058, the conductive particles are in physically contact with the line pattern of the substrate and the line connection part of the electronic component. Accordingly, the line pattern of the substrate and the line connection part of the electronic component are electrically connected to each other. However, since the conductive particles are dispersed in the thermosetting resin, the connection resistance tends to increase.

In addition, between the substrate and the electronic component, there exists an insulated part other than the junction portion part between the line pattern of the substrate and the line connection part of the electronic component. Some of the conductive particles dispersed in the thermosetting resin are interposed between the substrate and the electronic component corresponding to the insulated part. This decreases the insulating properties in the insulated part.

Furthermore, recently there has been a trend in display devices, in which the display image has become finer, and the pitch (interval) of the line pattern of the substrate has narrowed to 100 µm or less, for example. When line patterns having a narrow pitch are used, technical problems such as an increase in the connection resistance and a decrease in the insulating properties due to use of the anisotropic conductive film, become more significant.

As such, there is a continuing need in the art for a method of installing or mounting electronic components that do not have these limitations.

BRIEF SUMMARY

Accordingly, the present disclosure is directed to a display device, a display system, and a method of an installing electronic component. The disclosed method substantially obviates one or more of the technological problems due to limitations of the related art.

Additional features and embodiments of the present disclosure will be set forth in the description which follows, and will be apparent from the description. These and other technological improvements of the present disclosure will be realized and attained by the structure particularly pointed out in the written description and claims hereof as well as the appended drawings.

As embodied and broadly described herein, the present disclosure provides a method of installing an electronic component that includes disposing the electronic component having an electronic component side line connection part at a vertical end surface of a substrate stack including two substrates, a line between the two substrates, and a substrate side line connection part at an end of the line. The electronic component side line connection part faces the vertical end surface. The method further includes forming an auto-agglutination solder between the electronic component side line connection part and the substrate side line connection part. The auto-agglutination solder includes a thermosetting resin and a solder particle. Additionally, the method includes pressurizing the electronic component side line connection part and the substrate side line connection part by heating-up the auto-agglutination solder.

In another embodiment, the present disclosure is directed towards a display device that includes a substrate stack having two substrates, a line between the two substrates, and a substrate side line connection part at an end of the line. The display device further includes an electronic component having an electronic component side line connection part. The electronic component side line connection part faces a vertical end surface of the substrate stack. Additionally, the display device includes a junction part that electrically joins the vertical end surface and the electronic component. The junction part includes a solder junction part between the substrate side line connection part and the electronic component side line connection part. The junction part also includes a resin junction part at a region outside the solder junction part that adheres the vertical end surface and the electronic component.

In another embodiment, the present disclosure is directed towards a display system that includes a first display device, a second display device adjacent to the first display device along a first direction, and a third display device adjacent to the first display device along a second direction. At least one of the first, second, and third display devices includes: a substrate stack having two substrates, a line between the two substrates and a substrate side line connection part at an end of the line; an electronic component having an electronic component side line connection part, the electronic component side line connection part facing a vertical end surface of the substrate stack; and a junction part that electrically joins the vertical end surface and the electronic component. The junction part includes a solder junction part between the substrate side line connection part and the electronic component side line connection part. The junction part also includes a resin junction part at a region outside the solder junction part that adheres the vertical end surface and the electronic component.

The foregoing general description and the following detailed description are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

DETAILED DESCRIPTION

Reference will now be made in detail to the disclosed embodiments, examples of which are illustrated in the accompanying drawings.

Figure 1:
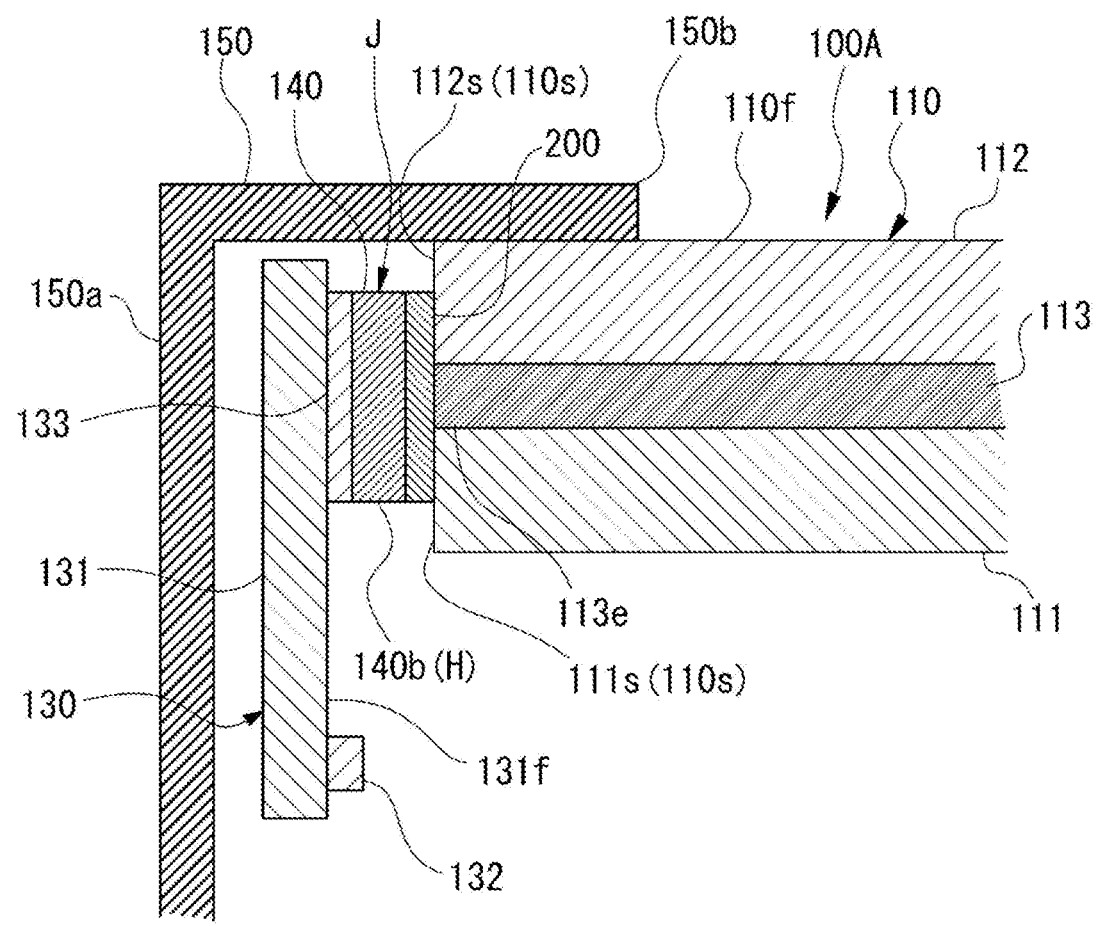
FIG. 1 is a schematic cross-sectional view of a portion of a display device according to a first embodiment of the present disclosure.
Figure 2:
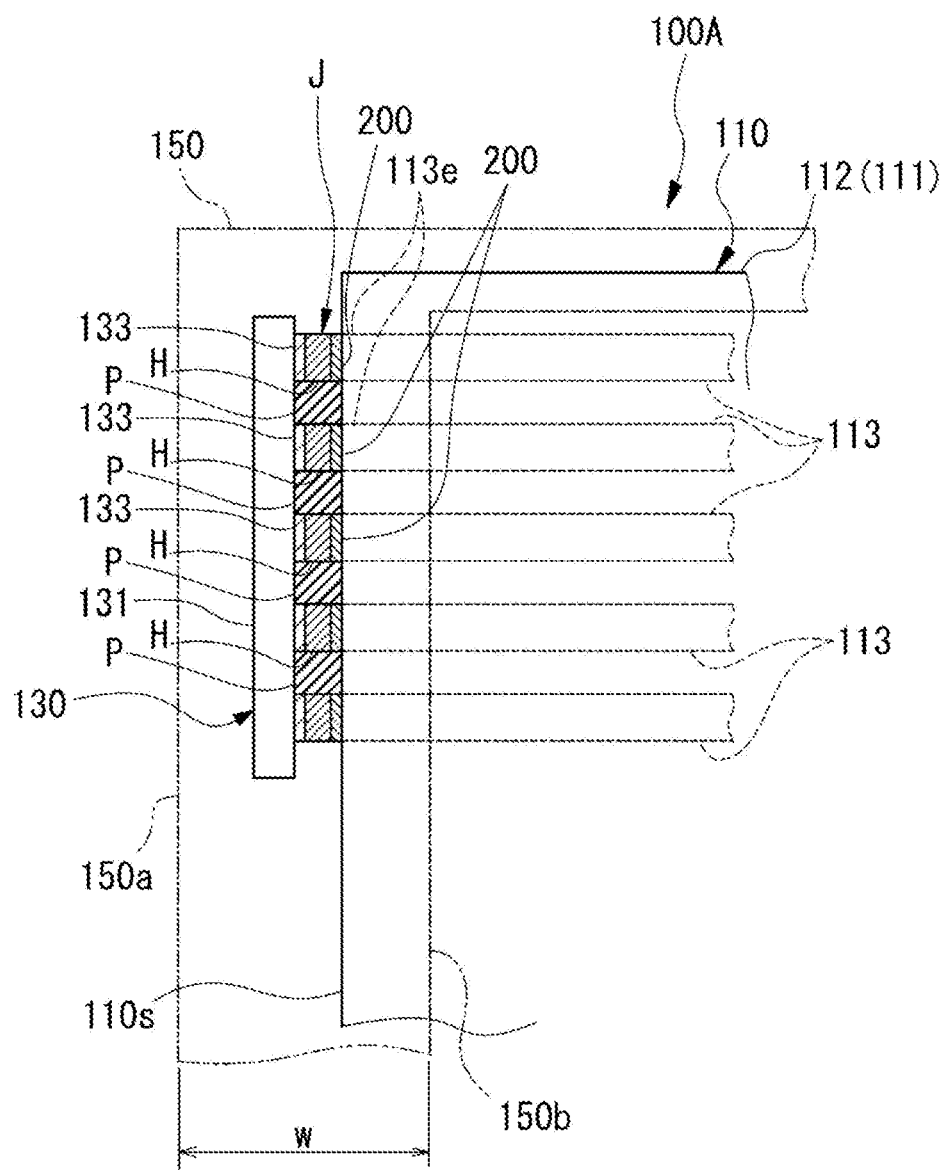
FIG. 2 is a schematic plane view of a portion of the display device.
Figure 3:
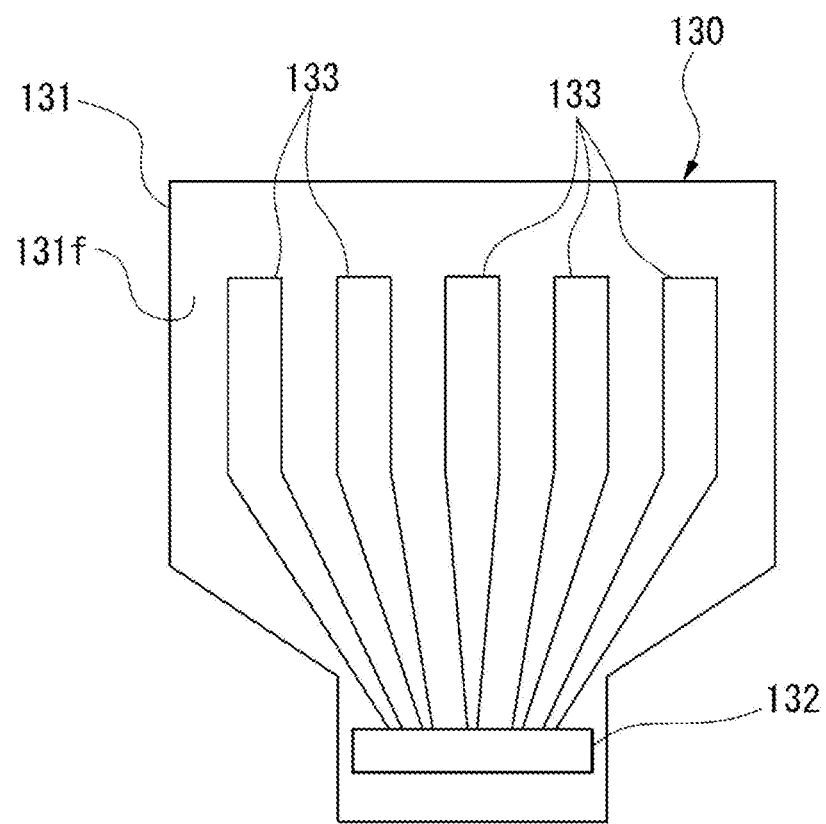
FIG. 3 is a view showing an electronic component for the display device.
Figure 4:
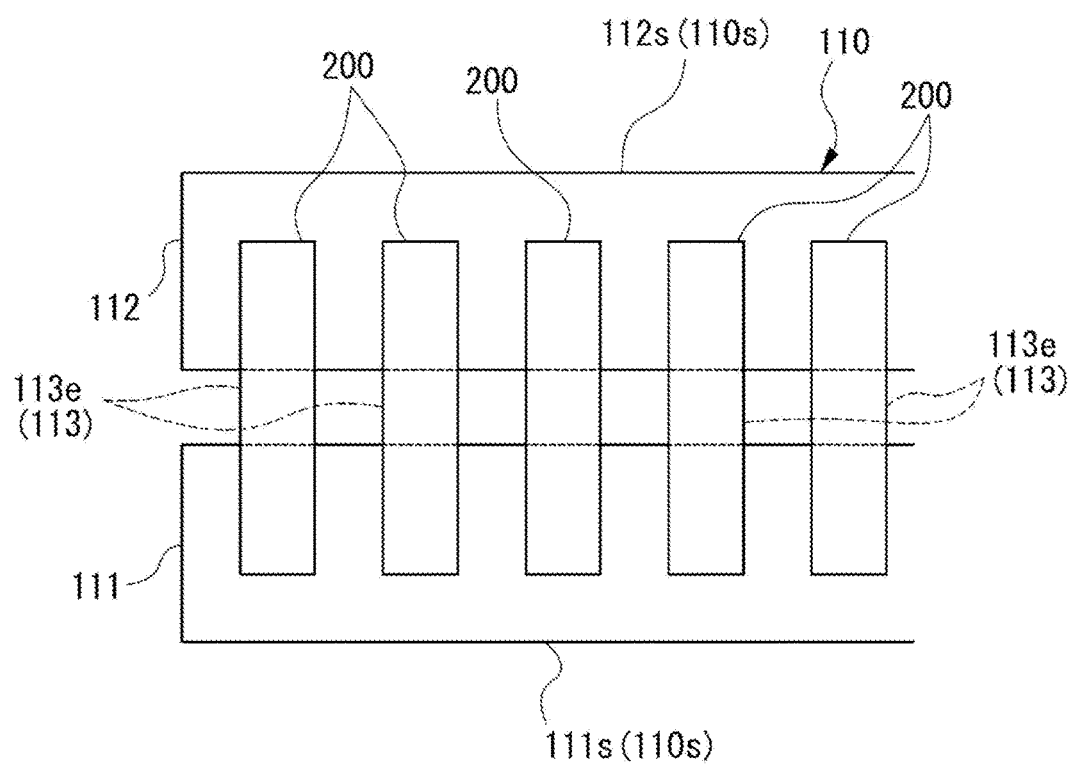
FIG. 4 is a side view of the display device including a junction pad at a vertical side.
Figure 5:
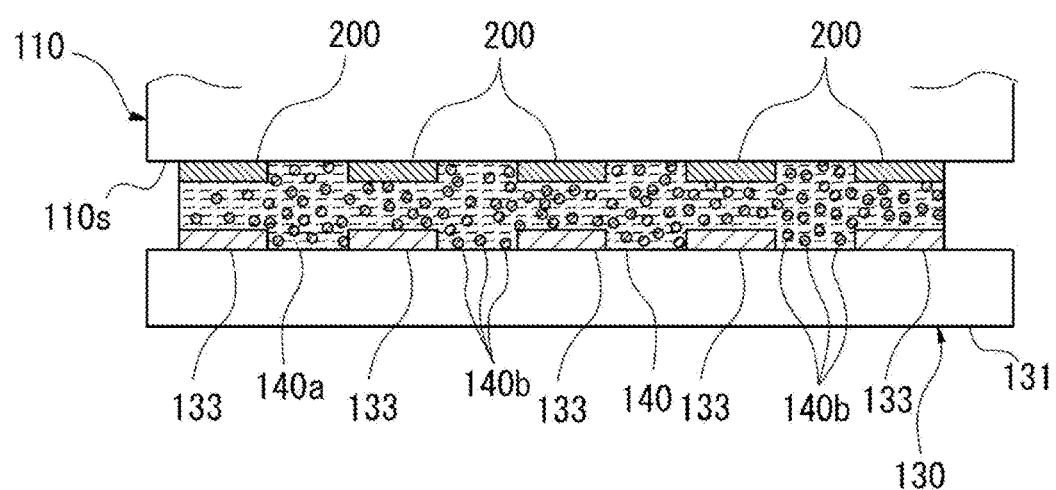
FIG. 5 is a view illustrating a step of coating an auto-agglutination solder.
Figure 6:
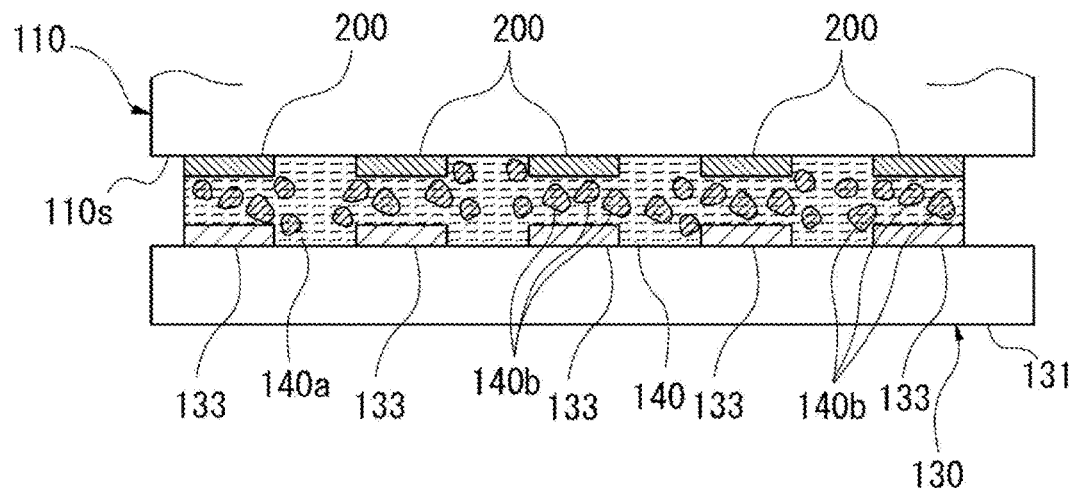
FIG. 6 is a view illustrating a step of starting agglutination of the auto-agglutination solder particles.
Figure 7:
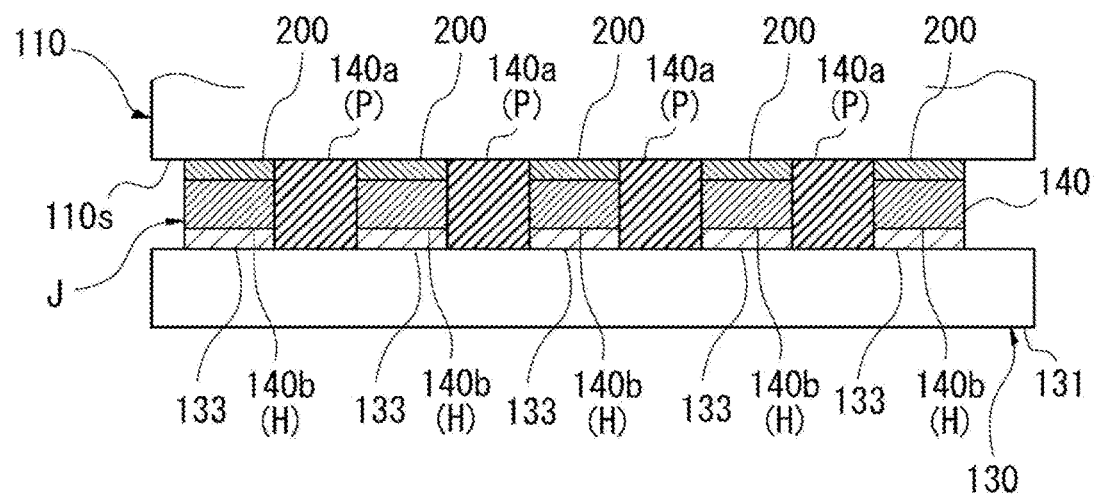
FIG. 7 is a view illustrating the junction of the electronic component to the vertical side of the display device by auto-agglutination of the auto-agglutination solder particles.
Figure 8:
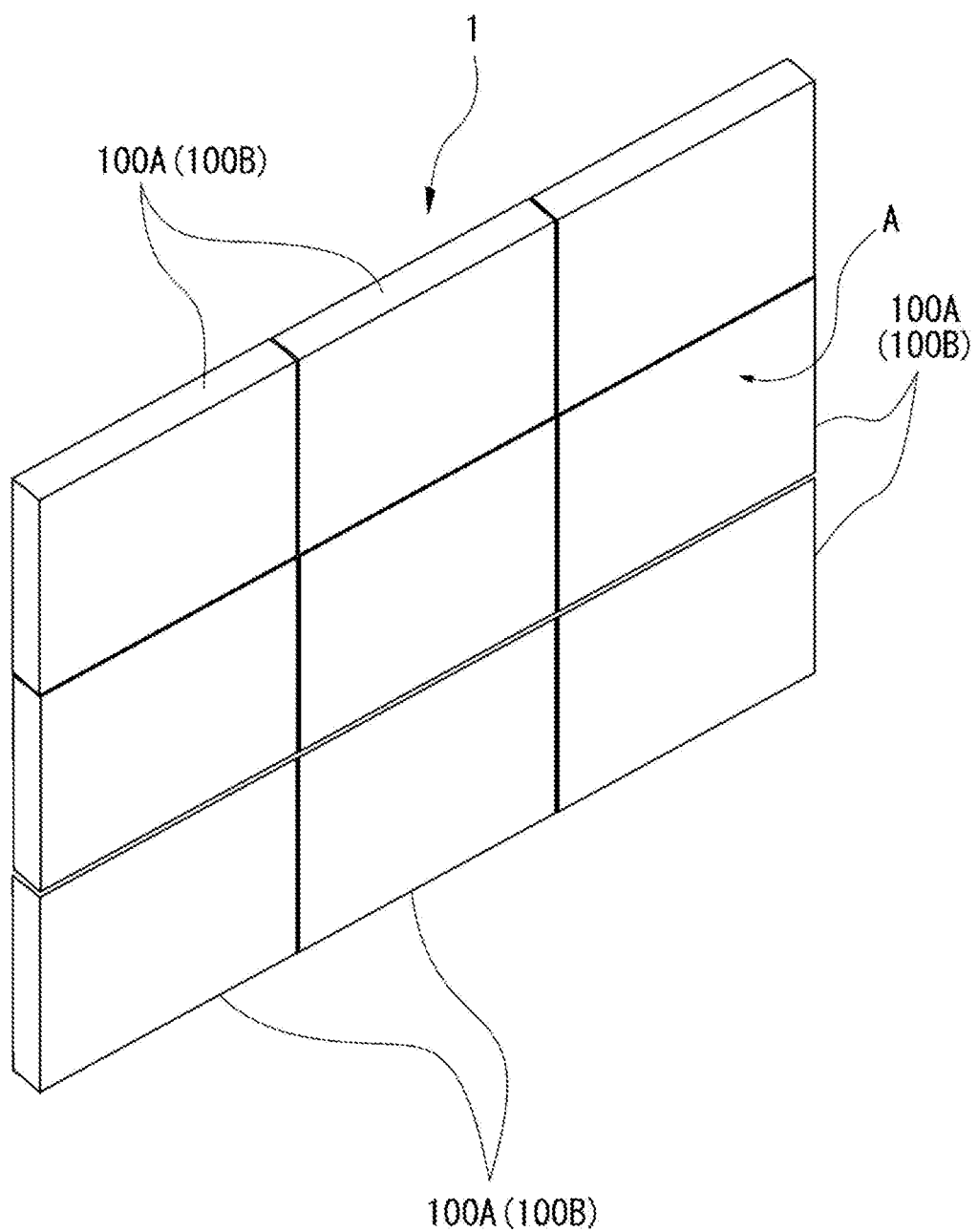
FIG. 8 is a perspective view of a display system.

FIG. 1 is a schematic cross-sectional view of a portion of a display device according to a first embodiment of the present disclosure. FIG. 2 is a schematic plane view of a portion of the display device. FIG. 3 is a view showing an electronic component for the display device. FIG. 4 is a side view of the display device including a junction pad at a vertical side. FIG. 5 is a view illustrating a step of coating an auto-agglutination solder. FIG. 6 is a view illustrating a step of starting agglutination of the auto-agglutination solder particles. FIG. 7 is a view illustrating the junction of the electronic component to the vertical side of the display device by auto-agglutination of the auto-agglutination solder particles. FIG. 8 is a perspective view of a display system.

Referring to FIGS. 1 and 2, a display device 100A includes a display panel (e.g., a liquid crystal panel) 110, a light source (not shown) that emits light toward the display panel 110, and a light guiding part (not shown) that guides the light from the light source toward a rear side of the display panel 110. The display panel 110 may be referred to as a substrate stack or a substrate device.

The display panel 110 as the liquid crystal panel includes a first substrate (a substrate) 111, a second substrate (a substrate) 112 facing the first substrate (111) and a liquid crystal layer (not shown) between the first and second substrates 111 and 112.

Each of the first and second substrates 111 and 112 may be one of a glass substrate, a resin substrate and a print substrate.

Although not shown, on at least one of the first and second substrates 111 and 112 (e.g., the first substrate 111), a plurality of line part (a line) 113 (which includes a signal line including a data line and a gate line), a thin film transistor, and so on, are formed. The liquid crystal layer is driven by the line part 113 such that the display device 100A provides an image. The line part 113 may have a single-layered structure formed of a low resistance conductive material, e.g., aluminum (Al) or copper (Cu). Alternatively, the line part 113 may have a multi-layered structure including a first layer formed of a lower resistance conductive material, e.g., Al or Cu and a second layer formed of a conductive material, e.g., chrome (Cr), molybdenum (Mo) or titanium (Ti).

An end 113e of each line part 113 is a drawout part of the line part 113. The end 113e has a single-layered structure formed of a conductive material that is capable of forming an electrical junction with the solder. The conductive material for the end 113e of the line part 113 may be one of tin (Sn), lead (Pb), zinc (Zn), silver (Ag) and copper (Cu). Alternatively, the end 113e of the line part 113 may have a multi-layered structure including a first layer of the above conductive material and a second layer formed of Cr, Mo or Ti.

In the display panel 110, the end surface 111s of the first substrate 111 and the end surface 112s of the second substrate 112 are disposed on the same plane. At the end of the display panel 110, a vertical end surface 110s, which is perpendicular to a display surface 110f, is formed (or defined) by the end surface 111s of the first substrate 111 and the end surface 112s of the second substrate 112.

In the vertical end surface 110s of the display panel 110, the electronic component 130 is installed. As shown in FIGS. 1 and 3, the electronic component 130 may include a line substrate (a film substrate) 131 as a film type and a chip component 132, e.g., a large scale integration (LSI), installed on a surface 131f of the line substrate 131. For example, the electronic component 130 may be a chip on film (COF). On the surface 131f of the line substrate 131, a plurality of connection electrodes (an electronic component side line connection part) 133, which are respectively junctioned with the line parts 113 of the display panel 110, are formed. The connection electrode 133 may be formed of a conductive material, e.g., Sn, Pb, Zn, Ag or Cu, that is capable of junctioning with the solder.

As shown in FIGS. 1 and 4, to install the electronic component 130, a connection pad (a substrate side line connection part) 200 is junctioned to the end 113e of each line part 113 between the first and second substrates 111 and 112. The connection pad 200, which has a band shape and covers a portion of the first substrate 111 and a portion of the second substrate 112, is formed along the vertical end surface 110s of the display panel 110. The connection pad 200 may be formed of a conductive material, e.g., Sn, Pb, Zn, Ag or Cu, that is capable of junctioning with the solder.

In some embodiments, the connection pad 200 may be formed from a paste or a nano-ink of Ag or Cu by a screen printing process, a mesh-mask printing process or an ink-jet process. For example, the connection pad 200 may have a width of about 10 to 100 nm, a length of about 0.1 to 1 mm and a thickness of about 10 to 1000 nm.

As shown in FIGS. 1 and 2, the electronic component 130 is solder-junctioned to the connection pad 200 at the vertical end surface 110s of the display panel 110 by an auto-agglutination solder 140. As shown in FIG. 5, the auto-agglutination solder 140 is a paste material. In the auto-agglutination solder 140, a solder particle 140b formed of a solder-alloy material, e.g., Cu or Sn, is uniformly dispersed in a thermosetting resin 140a. The thermosetting resin 140a is formed of a material having a melting point lower than the solder particle 140b.

For example, 'Reflow Self Assembly Anisotropic Conductive Paste Epowell AP series' (SEKISUI CHEMICAL CO., LTD) or 'Low-Temperature-Curable conductive' (Hitachi Chemical Co., Ltd.) may be used as the auto-agglutination solder 140.

The junction of the electronic component 130 to the connection pad 200 at the vertical end surface 110s of the display panel 110 is made using the auto-agglutination solder 140. In some embodiments, the auto-agglutination solder 140 is coated on the vertical end surface 110s of the display panel 110. For example, the auto-agglutination solder 140 may be coated by a screen printing process, a mesh-mask printing process, or an ink-jet process.

After coating the auto-agglutination solder 140, the electronic component 130 is positionally-aligned and adhered to the vertical end surface 110s of the display panel 110. Next, using the thermo-compressing device employed in the junction process with the anisotropic conductive film (ACF), the electronic component 130, where the connection electrode 133 is formed, is compressed to the vertical end surface 110s of the display device 110, where the connection pad 200 is formed. As a result, a pre-determined pressure and a pre-determined temperature are applied to the auto-agglutination solder 140 during a pre-determined period of time. For example, the pre-determined pressure may be applied to the auto-agglutination solder 140 under the temperature of 150° C. for 15 minutes.

As shown in FIG. 6, the thermosetting resin 140a and the solder particle 140b are melted by the applied heat, and the solder particles 140b are aggregated to each other and become closer to the connection pad 200 and the connection electrode 133. As a result, as shown in FIG. 7, the auto-agglutinated solder particle 140b is metallically bonded at a space between the connection pad 200 and the connection electrode 133. Namely, the connection pad 200 of the display panel 110 and the connection electrode 133 of the electronic component 130 are soldered by a solder metal (a solder junction part) "H" formed of a plurality of auto-agglutinated solder particles 140b. Additionally, the melted thermosetting resin 140a is aggregated in a space between adjacent connection pads 200 and/or between adjacent connection electrodes 133, such that the line substrate 131 of the electronic component 130 and the vertical end surface 110s of the display panel 110 are attached to each other by an insulating resin (a resin junction part) "P" formed of the thermosetting resin 140a.

The auto-agglutination solder 140 is cooled after the thermo-compressing process such that the junction of the electronic component 130 to the vertical end surface 110s of the display panel 110 is completed.

The connection pad 200 at the vertical end surface 110s of the display panel 110 and the connection electrode 133 on the line substrate 131 of the electronic component 130 are metallically bonded by the solder metal H of the auto-agglutination solder 140 such that the connection pad 200 and the connection electrode 133 are electrically connected. In addition, the vertical end surface 110s of the display panel 110 and the line substrate 131 of the electronic component 130 are mechanically attached (or bonded) by the metal bond by the solder metal H and the adhesion by the insulating resin P.

The mechanical junction between the vertical end surface 110s of the display panel 110 and the line substrate 131 of the electronic component by the solder metal H and the insulating resin P may have a tensile strength being equal to or greater than about 500 g/cm.

For example, the solder metal H between the connection pad 200 and the connection electrode 133 may have a thickness being equal to less than about 20 μm.

A pitch of the connection pad 200 (i.e., a distance between adjacent connection pads) and a pitch of the connection electrode 133 (i.e., a distance between adjacent connection electrodes) may be about 10 to 100 μm, respectively.

As shown in FIGS. 1 and 2, a bezel 150, which forms an outer case of the display device 100A, is installed at a periphery of the display panel 110 where the electronic component 130 is installed. For example, the bezel 150 may include a side plate part 150a at an outer side of the vertical end surface 110s of the display panel 110 and a front plate part 150b extending from the side plate part 150a toward a center of the display panel 110 and covering a front edge of the display surface 110f of the display panel 110. The electronic component 130 is accommodated in a space between the side plate part 150a of the bezel 150 and the vertical end surface 110s of the display panel 110.

As mentioned above, the vertical end surface 110s of the display panel 110 and the line substrate 131 of the electronic component 130 such that a width "w" of the bezel can be reduced. Namely, a narrow bezel display device 100A is provided.

In addition, a plurality of display devices 100A of the narrow bezel are arranged to form a display system 1. In the display system 1, the plurality of display devices 100A are adjacently arranged along a vertical direction and a horizontal direction. In the display system 1, an image is displayed at a display region "A" formed by the plurality of display device 100A.

Since the display system 1 includes the narrow bezel display devices 100A, a gap between adjacent display devices 100A is reduced such that a high quality image is provided at the display region "A."

An installation method of the electronic component 130 of the present disclosure includes disposing the connection electrode 133 of the electronic component to face the vertical end surface 110s of the display panel 110, including the connection pad 200 at the end 113e of the line part 113 between the first substrate 111 and the second substrate 112. The installation method further includes interposing (or coating) the auto-agglutination solder 140, which includes the thermosetting resin 140a and the solder particle 140b, between the connection electrode 133 and the connection pad 200. Additionally, the installation method includes pressurizing the connection pad 133 to the connection pad 200 by heating-up the auto-agglutination solder 140.

According to the installation method of the electronic component 130 of the present disclosure, the solder metal H, which is created by the aggregation of the solder particles 140b, is formed between the connection electrode 133 and the connection pad 200. In comparison to use of ACF, the amount of the conductive particles between the connection electrode 133 and the connection pad 200 is increased such that the increase of the contact (or connection) resistance between the connection electrode 133 and the connection pad 200 is prevented.

In addition, the vertical end surface 110s of the display panel 110 and the electronic component 130 are mechanically attached (or bonded) by the metal bond of the solder metal H of the solder particle 140b and by the adhesion of the insulating resin P of the thermosetting resin 140b, such that the electronic component 130 and the display device 110 are securely junctioned.

Moreover, in the junction structure of the electronic component 130, the display panel 110, the display device 100A, and the display system 1, there is an junction part "J" that electrically joins the connection pad 200 at the vertical end surface 110s of the display panel 110 (which includes the first substrate 111, the second substrate 112, and the connection pad 200 at the end 113e of the line part 113 between the first and second substrates 111 and 112) with the electronic component 130 (which includes the connection electrode 133 facing the vertical end surface 110s of the display panel 110). The junction part "J" includes the solder metal "H" between the connection pad 200 and the connection electrode 133 and the insulating resin "P" attaching (adhering) the vertical end surface 110s and the electronic component 130 in a region outside the solder metal "H."

In the present disclosure, the electronic component 130 is securely combined (junctioned or connected) to the vertical end surface 110s of the display panel 110, and the electric connection property is increased such that the increase of the connection resistance (contact resistance) is prevented.

Figure 9:
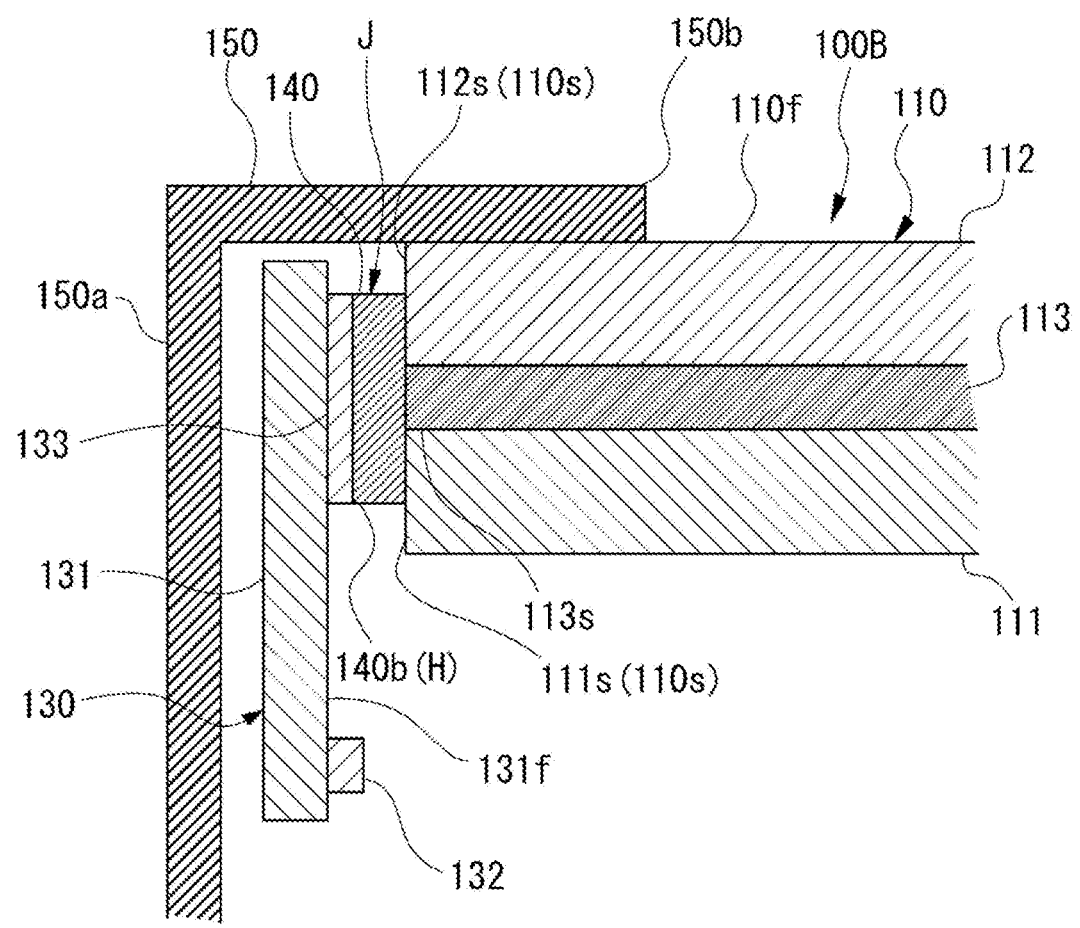
FIG. 9 is a schematic cross-sectional view of a portion of a display device according to a second embodiment of the present disclosure.
Figure 10:
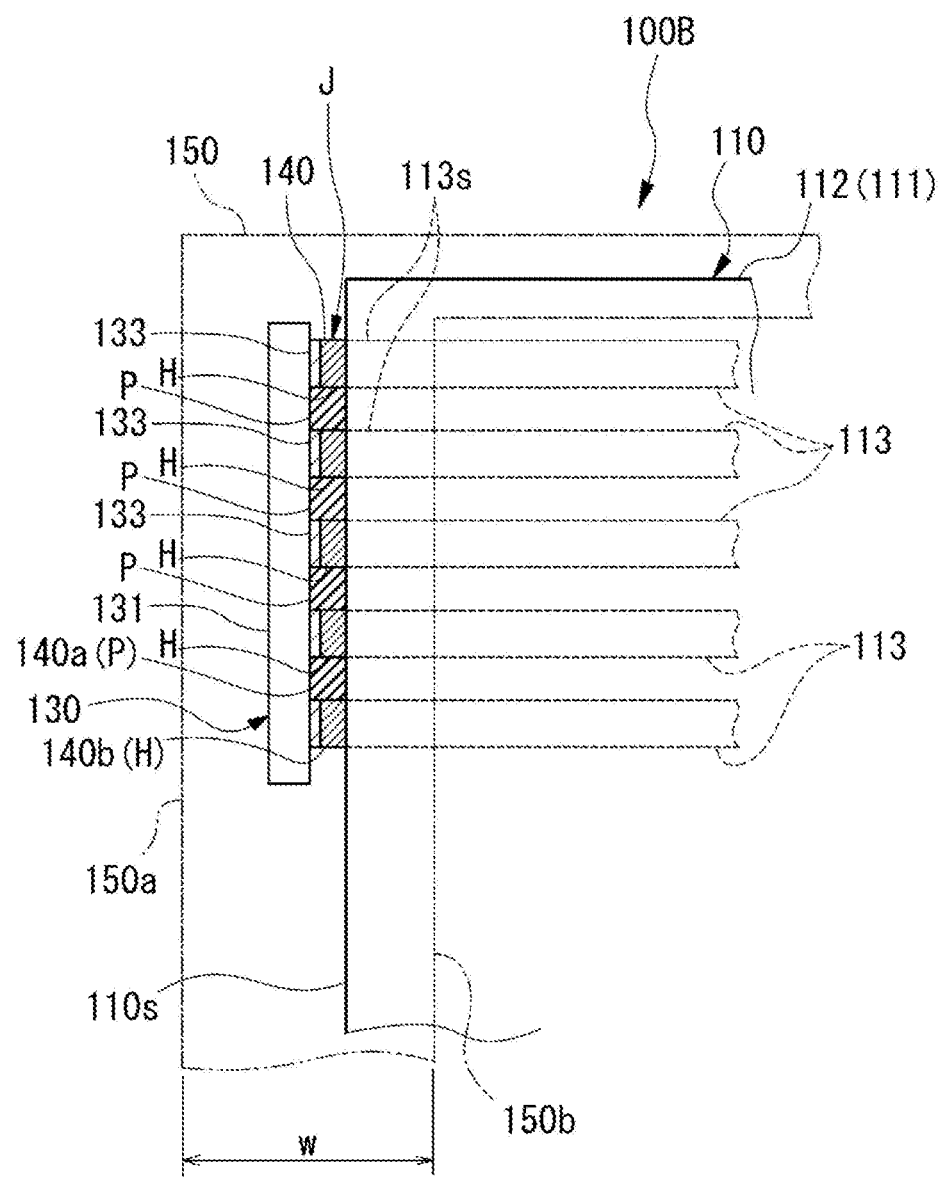
FIG. 10 is a schematic plane view of a portion of the display device.

FIG. 9 is a schematic cross-sectional view of a portion of a display device according to a second embodiment of the present disclosure. FIG. 10 is a schematic plane view of a portion of the display device. The same reference numbers are used to the same elements as the first embodiment, and the explanation for those may be omitted.

Referring to FIGS. 9 and 10, a display device 100B includes a display panel (e.g., a liquid crystal panel) 110, a light source (not shown) that emits light toward the display panel 110, and a light guiding part (not shown) that guides the light from the light source toward a rear side of the display panel 110. The display panel 110 may be referred to as a substrate stack or a substrate device.

The display panel 110 as the liquid crystal panel includes a first substrate (a substrate) 111, a second substrate (a substrate) 112 facing the first substrate (111), and a liquid crystal layer (not shown) between the first and second substrates 111 and 112.

Each of the first and second substrates 111 and 112 may be one of a glass substrate, a resin substrate, and a print substrate.

Although not shown, on at least one of the first and second substrates 111 and 112 (e.g., the first substrate 111), a plurality of line part (a line) 113, which includes a signal line including a data line and a gate line, a thin film transistor, and so on, are formed. The liquid crystal layer is driven by the line part 113 such that the display device 100A provides an image. The line part 113 may have a single-layered structure formed of a low resistance conductive material, e.g., aluminum (Al) or copper (Cu). Alternatively, the line part 113 may have a multi-layered structure including a first layer formed of a lower resistance conductive material, e.g., Al or Cu and a second layer formed of a conductive material, e.g., chrome (Cr), molybdenum (Mo) or titanium (Ti).

An end 113e of each line part 113 is a drawout part of the line part 113 and has a single-layered structure formed of a conductive material that is capable of forming the electrical junction with the solder. The conductive material for the end 113e of the line part 113 may be one of tin (Sn), lead (Pb), zinc (Zn), silver (Ag) and copper (Cu). Alternatively, the end 113e of the line part 113 may have a multi-layered structure including a first layer of the above conductive material and a second layer formed of Cr, Mo or Ti.

In the display panel 110, the end surface 111s of the first substrate 111 and the end surface 112s of the second substrate 112 are disposed on the same plane. At the end of the display panel 110, a vertical end surface 110s, which is perpendicular to a display surface 110f, is formed (or defined) by the end surface 111s of the first substrate 111 and the end surface 112s of the second substrate 112.

At the vertical end surface 110s of the display panel 110, an end part 113s of the line part 113 (a substrate side line connection part) is disposed on the same plane with the end surface 111s of the first substrate 111 and the end surface 112s of the second substrate 112 such that the end part 113s of the line part 113 is exposed.

At the vertical end surface 110s of the display panel 110, the electronic component 130 is installed. The electronic component 130 may include a line substrate (a film substrate) 131 as a film type and a chip component 132, e.g., a large scale integration (LSI), installed (or arranged) on a surface 131f of the line substrate 131. For example, the electronic component 130 may be a chip on film (COF). On the surface 131f of the line substrate 131, a plurality of connection electrodes (an electronic component side line connection part) 133, which are respectively junctioned with the line parts 113 of the display panel 110, are formed. The connection electrode 133 may be formed of a conductive material, e.g., Sn, Pb, Zn, Ag or Cu, that is capable of junctioning with the solder. A vertical length (length) of the connection electrode 133 along a direction from the first substrate 111 to the second substrate 112 (or the second substrate 112 to the first substrate 111) is larger than that of the substrate side line connection part (i.e., the end part of the line part 113) 113s.

The electronic component 130 is solder-junctioned to the end part (i.e., the substrate side line connection part) 113s of the line part 113, which is exposed at the vertical end surface 110s of the display panel 110, by an auto-agglutination solder 140. As shown in FIG. 5, the auto-agglutination solder 140 is a paste material. In the auto-agglutination solder 140, a solder particle 140b formed of a solder-alloy material, e.g., Cu or Sn, is uniformly dispersed in a thermosetting resin 140a. The thermosetting resin 140a is formed of a material having a melting point lower than the solder particle 140b.

For example, 'Reflow Self Assembly Anisotropic Conductive Paste Epowell AP series' (SEKISUI CHEMICAL CO., LTD) or 'Low-Temperature-Curable conductive' (Hitachi Chemical Co., Ltd.) may be used as the auto-agglutination solder 140.

The junction of the electronic component 130 to the end part (the substrate side line connection part) 113s at the vertical end surface 110s of the display panel 110 is made using the auto-agglutination solder 140. In some embodiments, the auto-agglutination solder 140 is coated on the vertical end surface 110s of the display panel 110. For example, the auto-agglutination solder 140 of the paste phase may be coated by a screen printing process, a mesh-mask printing process, or an ink-jet process.

After coating the auto-agglutination solder 140, the electronic component 130 is positionally-aligned and adhered to the vertical end surface 110s of the display panel 110. Next, using the thermo-compressing device used in the junction process with the anisotropic conductive film (ACF), a pre-determined pressure and a pre-determined temperature are applied to the auto-agglutination solder 140 during a pre-determined period of time. For example, the pre-determined pressure may be applied to the auto-agglutination solder 140 under the temperature of 150° C. for 15 minutes.

As shown in FIGS. 6 and 7, the thermosetting resin 140a and the solder particle 140b are melted by the applied heat, and the auto-agglutinated solder particle 140b is metallically bonded at a space between the connection pad 200 and the end part 113s of the line part 113. Namely, the connection pad 200 of the display panel 110 and the connection electrode 133 of the electronic component 130 are soldered by a solder metal (a solder junction part) "H" formed of a plurality of auto-agglutinated solder particles 140b. Additionally, the melted thermosetting resin 140a is aggregated in a space between the vertical end surface 110s of the display panel 110 and the line substrate 131 of the electronic component 130 except the region of the solder metal H such that an insulating resin (a resin junction part) "P" is formed from the thermosetting resin 140a.

The auto-agglutination solder 140 is cooled after the thermo-compressing process such that the junction of the electronic component 130 to the vertical end surface 110s of the display panel 110 is completed.

The end part 113s of the line part 113, which is exposed at the vertical end surface 110s of the display panel 110, and the connection electrode 133 on the line substrate 131 of the electronic component 130, are metallically bonded by the solder metal H of the auto-agglutination solder 140 such that they are electrically connected.

In addition, the vertical end surface 110s of the display panel 110 and the line substrate 131 of the electronic component 130 are mechanically attached (or bonded) by the metal bond of the solder metal H and by the adhesion of the insulating resin P.

The mechanical junction between the vertical end surface 110s of the display panel 110 and the line substrate 131 of the electronic component, by the solder metal H and the insulating resin P, may have a tensile strength that is equal to or greater than about 500 g/cm.

For example, the solder metal H between the end part 113s and the connection electrode 133 may have a thickness that is equal to less than about 20 μm.

A pitch of the end part 113s and a pitch of the connection electrode 133 may be about 10 to 100 μm, respectively.

A bezel 150, which forms an outer case of the display device 100B, is installed at a periphery of the display panel 110 where the electronic component 130 is installed. For example, the bezel 150 may include a side plate part 150a at an outer side of the vertical end surface 110s of the display panel 110 and a front plate part 150b extending from the side plate part 150a toward a center of the display panel 110 and covering a front edge of the display surface 110f of the display panel 110. The electronic component 130 is accommodated in a space between the side plate part 150a of the bezel 150 and the vertical end surface 110s of the display panel 110.

As mentioned above, the vertical end surface 110s of the display panel 110 and the line substrate 131 of the electronic component 130 such that a width "w" of the bezel can be reduced. Namely, a narrow bezel display device 100B is provided.

In addition, a plurality of display devices 100B of the narrow bezel are arranged to form a display system 1, as shown in FIG. 8. In the display system 1, the plurality of display devices 100B are adjacently arranged along a vertical direction and a horizontal direction. In the display system 1, an image is displayed at a display region "A" formed by the plurality of display device 100A.

Since the display system 1 includes the narrow bezel display devices 100B, a gap between adjacent display devices 100B is reduced such that a high quality image is provided at the display region "A."

The installation method of the electronic component 130 of the present disclosure includes disposing the connection electrode 133 of the electronic component to face the vertical end surface 110s of the display panel 110 including the line part 113 between the first substrate 111 and the second substrate 112. The installation method further includes interposing (or coating) the auto-agglutination solder 140, which includes the thermosetting resin 140a and the solder particle 140b, between the connection electrode 133 and the end part 113s of the line part 113. Additionally, the installation method includes pressurizing the connection pad 133 to the end part 113s by heating-up the auto-agglutination solder 140.

According to the installation method of the electronic component 130 of the present disclosure, the solder metal H, which is created by aggregation of the solder particles 140b, is formed between the connection electrode 133 and the end part 113s of the line part 113. In comparison to the use of ACF film, the amount of the conductive particles between the connection electrode 133 and the end part 113s is increased such that the increase of the contact (or connection) resistance between the connection electrode 133 and the end part 113s is prevented.

In addition, the vertical end surface 110s of the display panel 110 and the electronic component 130 are mechanically attached (or bonded) by the metal bond of the solder metal H of the solder particle 140b and by the adhesion of the insulating resin P of the thermosetting resin 140a, such that the electronic component 130 and the display device 110 is securely junctioned.

Moreover, since the end part 113s of the line part 113, which is exposed at a space between the first and second substrates 111 and 112, is defined as the substrate side line connection part, the connection part 200 is not required. Accordingly, the process of forming the connection pad 200 is omitted such that the production efficiency is increased and the production cost is decreased.

Further, in the junction structure of the electronic component 130, the display panel 110, the display device 100B and the display system 1, there is an junction part "J" that electrically joins the connection pad 200 at the vertical end surface 110s of the display panel 110 (which includes the first substrate 111, the second substrate 112, and the line part 113 at the end 113e of the line part 113 between the first and second substrates 111 and 112) with the electronic component 130 (which includes the connection electrode 133 facing the vertical end surface 110s of the display panel 110). The junction part "J" includes the solder metal "H" between the connection pad 200 and the connection electrode 133 and the insulating resin "P" attaching (adhering) the vertical end surface 110s and the electronic component 130 in a region outside the solder metal "H."

In the present disclosure, the electronic component 130 is securely combined (junctioned or connected) to the vertical end surface 110s of the display panel 110, and the electric connection property is increased such that the increase of the connection resistance (contact resistance) is prevented.

Figure 11:
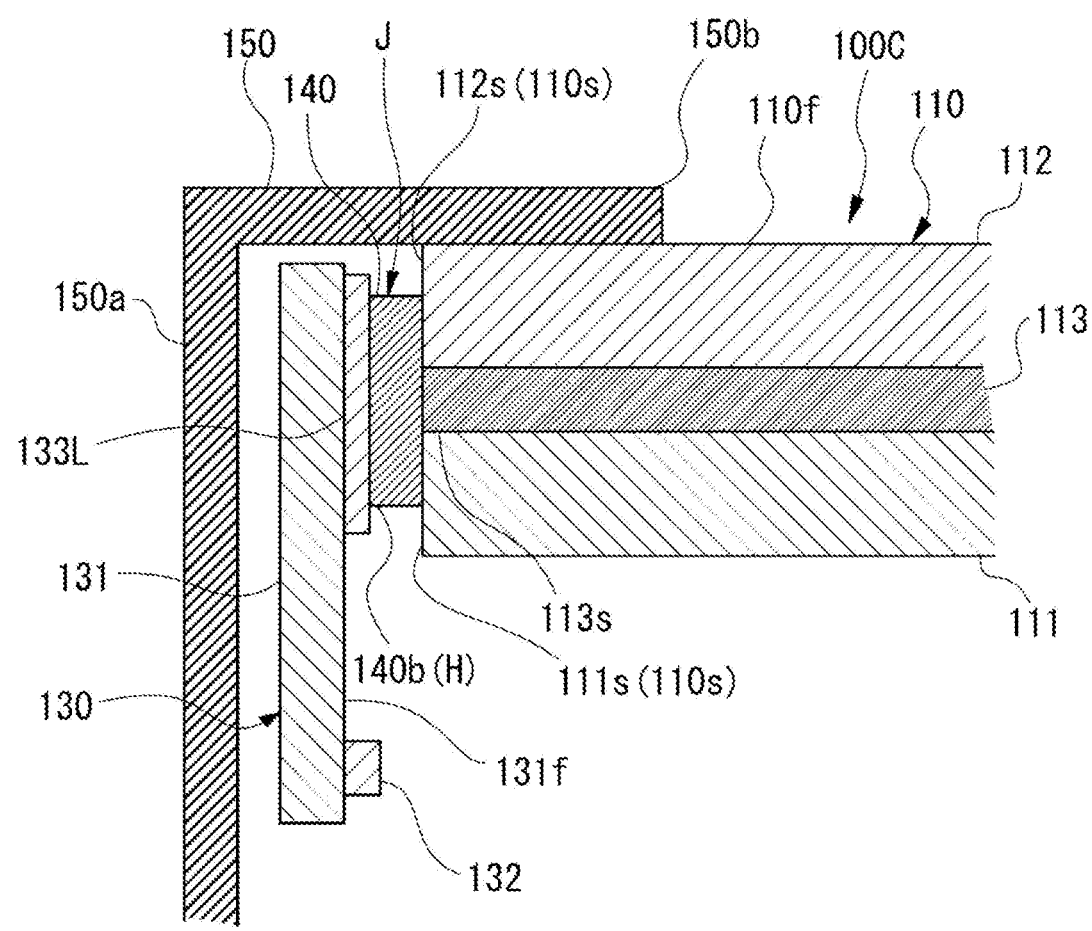
FIG. 11 is a schematic cross-sectional view of a portion of a display device according to a third embodiment of the present disclosure.
Figure 12:
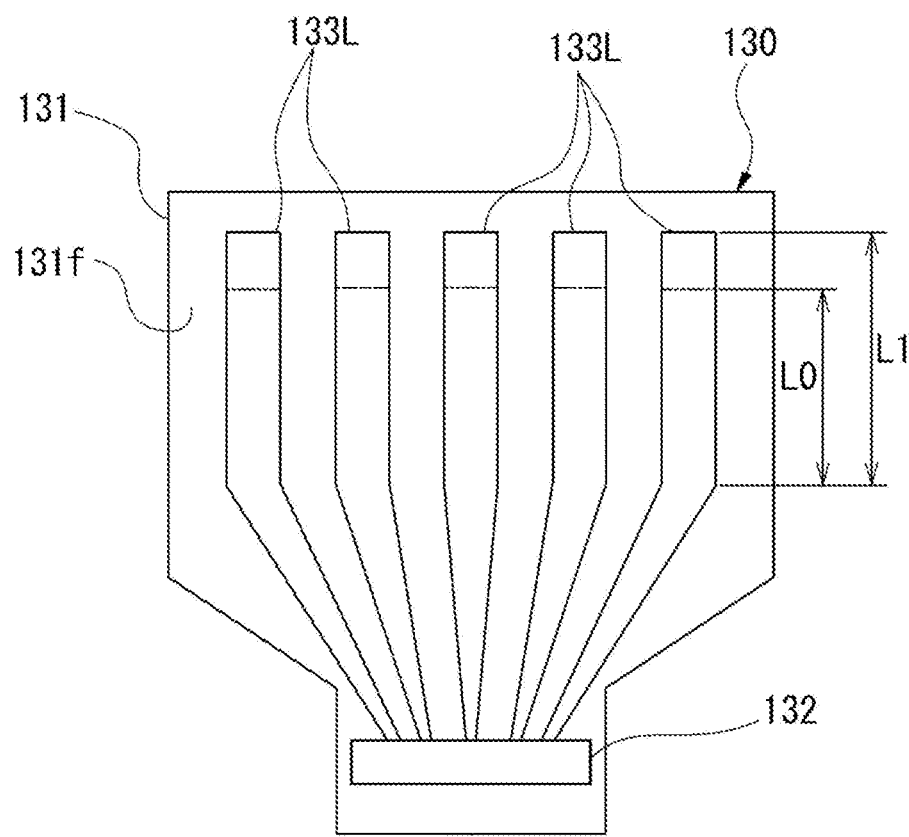
FIG. 12 is a view showing an electronic component for the display device.
Figure 13:
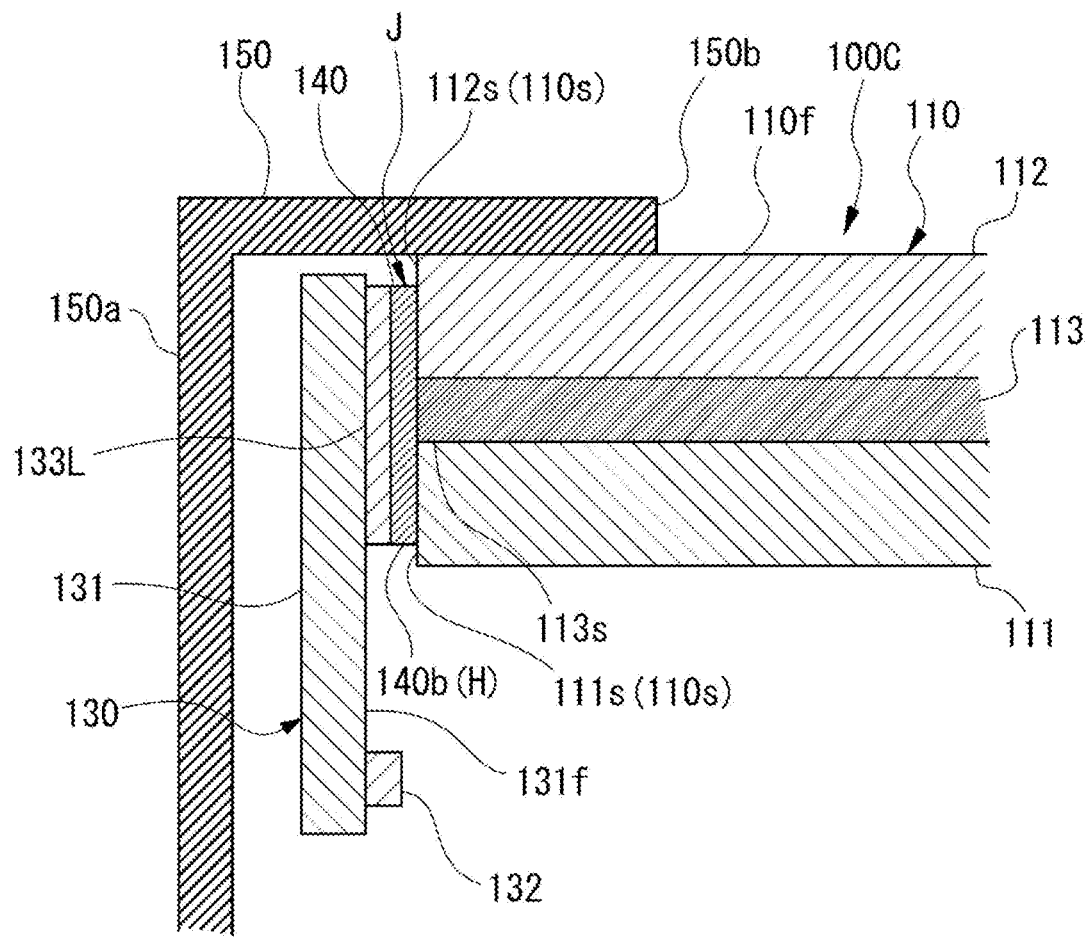
FIG. 13 is a view illustrating a display device with over-pressure for the junction of the electronic component.
Figure 14:
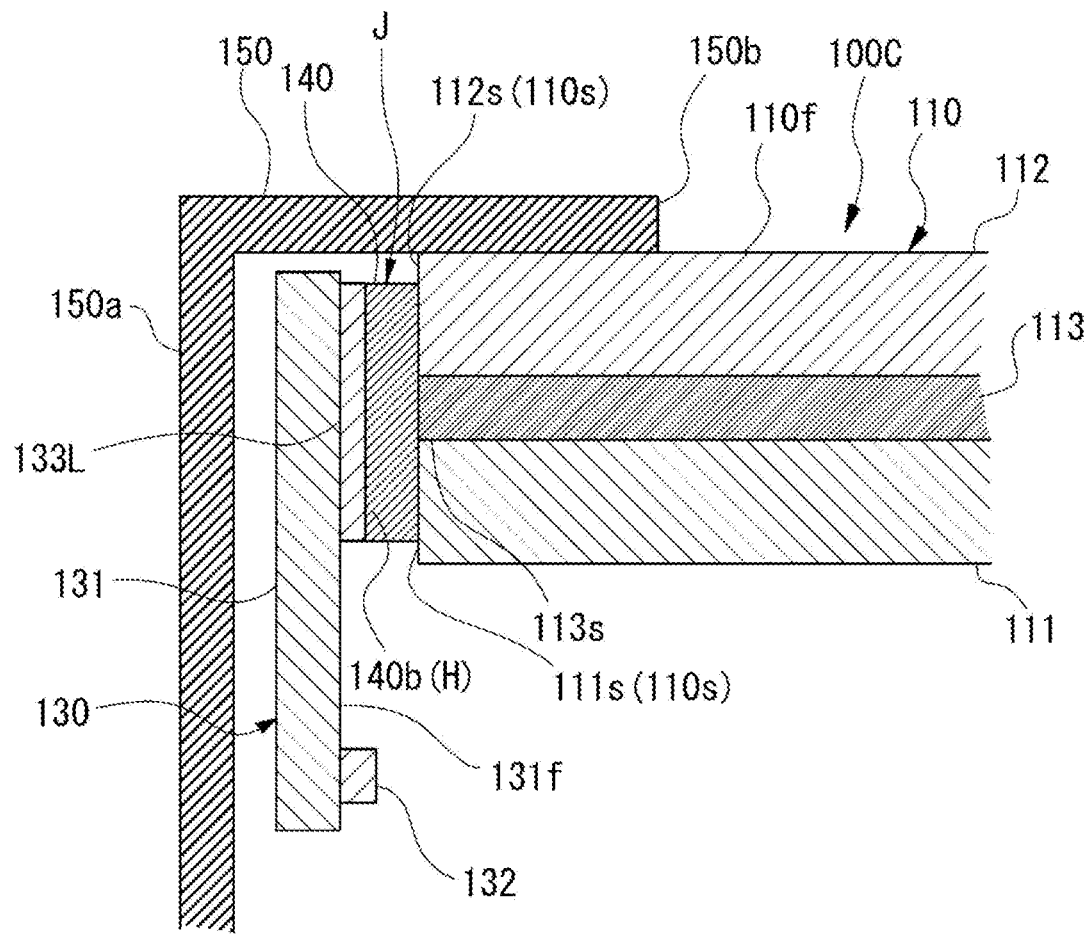
FIG. 14 is a view illustrating a display device with over-supply of the auto-agglutination solder material.

FIG. 11 is a schematic cross-sectional view of a portion of a display device according to a third embodiment of the present disclosure. FIG. 12 is a view showing an electronic component for the display device. FIG. 13 is a view illustrating a display device with over-pressure for the junction of the electronic component. FIG. 14 is a view illustrating a display device with over-supply of the auto-agglutination solder material. The same reference numbers are used to the same elements as the first and second embodiments, and the explanation for those may be omitted.

As shown in FIG. 11, a display device 110C includes substantially the same elements as the display device. In the display panel 110, the end surface 111s of the first substrate 111 and the end surface 112s of the second substrate 112 are disposed on the same plane. At the end of the display panel 110, a vertical end surface 110s, which is perpendicular to a display surface 110f, is formed (or defined) by the end surface 111s of the first substrate 111 and the end surface 112s of the second substrate 112.

At the vertical end surface 110s of the display panel 110, an end part 113s of the line part 113 is disposed on the same plane with the end surface 111s of the first substrate 111 and the end surface 112s of the second substrate 112, such that the end part 113s of the line part 113 is exposed.

At the vertical end surface 110s of the display panel 110, the electronic component 130 is installed. As shown in FIGS. 11 and 12, the electronic component 130 includes a line substrate 131 and a chip component 132 installed on a surface 131f of the line substrate 131.

On the surface 131f of the line substrate 131, a plurality of connection electrodes 133L, which are respectively junctioned with the line parts 113 of the display panel 110, are formed. The connection electrode 133L may be formed of a conductive material, e.g., Sn, Pb, Zn, Ag or Cu, that is capable of junctioning with the solder.

A vertical length (length) of the connection electrode 133L along a direction from the first substrate 111 to the second substrate 112 (or the second substrate 112 to the first substrate 111) is larger than that of the substrate side line connection part 113s. The length L1 of the connection electrode 133L is larger than the length L0 of the connection electrode 133 in the first embodiment. In addition, the length L1 of the connection electrode 133L may be larger than the length of the connection pad 200 (of FIG. 1).

The length L0 of the connection electrode 133 is a designed value. Based on the amount of the solder particle 140b in the auto-agglutination solder 140, a thickness (designed value) of the solder metal H after soldering is finished. The length L0 is designed such that the solder metal H, which is formed by melting and aggregation of the solder particle 140b, is formed throughout an entire of the connection electrode 133.

On the other hand, the length L1 of the connection electrode 133L is larger than the length L0 of the connection electrode 133, for example, by 30%.

The connection electrode 133L of the electronic component 130 is solder-junctioned to the end part 113s of the line part 113, which is exposed at the vertical end surface 110s of the display panel 110, by using the auto-agglutination solder 140.

The end part 113s of the line part 113 in the display panel 110 and the connection electrode 133L of the electronic component 130 are solder functioned by the solder metal H formed from the solder particle 140b, which is melted and aggregated. In addition, in a region outside the solder metal "H" and at a space between the line substrate 131 of the electronic component 130 and the vertical end surface 110s of the display panel 110, the melted thermosetting resin 140a gathers together such that the insulating resin "P" from the thermosetting resin 140a is formed.

The end part 113s of the line part 113, which is exposed at the vertical end surface 110s of the display panel 110, and the connection electrode 133L on the line substrate 131 of the electronic component 130, are selectively and metallically bonded by the solder metal H of the auto-agglutination solder 140 to be electrically connected. In addition, the vertical end surface 110s of the display panel 110 and the line substrate 131 of the electronic component 130 are mechanically attached (or bonded) by the metal bond of the solder metal H and by the adhesion of the insulating resin P.

As shown in FIG. 13, when the electronic component 130 is junctioned to the vertical end surface 110s of the display panel 110 using the auto-agglutination solder 140, an over-pressure may be applied to the electronic component 130 and the vertical end surface 110s of the display panel 110 by an operating error of the thermo-compressing device. Next, a gap between the vertical end surface 110s of the display panel 110 and the line substrate 131 of the electronic component 130 is decreased such that the auto-agglutination solder 140 may be thrust beyond the connection electrode. However, in the present disclosure, since the connection electrode 133L has a relatively large length, the protrusion of the auto-agglutination solder 140 beyond the connection electrode 133L is prevented.

As shown in FIG. 14, when the amount of the auto-agglutination solder 140 coated between the end part 113s of the line part 113 (which is exposed at the vertical end surface 110s of the display panel 110) and the line substrate 131 of the electronic component 130 is excessive, the auto-agglutination solder 140 may be thrust beyond the connection electrode. However, in the present disclosure, since the connection electrode 133L has a relatively large length, the protrusion of the auto-agglutination solder 140 beyond the connection electrode 133L is prevented.

In the installation method of the electronic component 130, the connection electrode 133L has the length that is larger than the reference length L0, which is designed based on the amount of the solder particle 140b required for soldering of the connection electrode 133L and the end part 113s and the gap (i.e., the thickness of the solder metal "H") between the connection electrode 133L and the end part 113s, of the connection electrode 133 of the second embodiment.

Accordingly, even if the over-pressure is applied to the vertical end surface 110s of the display panel 110 and the electronic component 130 or the amount of the auto-agglutination solder 140 is excessive, the protrusion of the auto-agglutination solder 140 beyond the connection electrode 133L is prevented such that the electrical short between adjacent connection electrodes 133L by the auto-agglutination solder 140 is prevented.

In addition, similar to the second embodiment, the connection electrode 133L of the electronic component 130 and the end part 113s of the line part 113 is soldered by aggregation of the solder particles 140b of the auto-agglutination solder 140. As a result, in comparison to ACF, the amount of the conductive particles between the connection electrode 133L of the electronic component 130 and the end part 113s of the line part 113 is increased such that the increase of the contact (or connection) resistance between the connection electrode 133L of the electronic component 130 and the end part 113s of the line part 113 is prevented.

Moreover, the electronic component 130 and the vertical end surface 110s of the display panel 110 are mechanically attached (or bonded) by the metal bond of the solder metal H of the solder particle 140b and by the adhesion of the insulating resin P of the thermosetting resin 140a, such that the electronic component 130 and the display device 110 is securely junctioned.

The installation method of the electronic component 130 and the junction structure of the electronic component 130 may be applied to various electronic devices beside the display device 100A to 100C.

In addition, the display device 100A to 100C may be an organic light emitting diode display device or a plasma display device as well as the LCD device.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
a substrate stack including two substrates, a line between the two substrates, and a substrate side line connection part at an end of the line;
an electronic component including an electronic component side line connection part, the electronic component side line connection part facing a vertical end surface of the substrate stack; and
a junction part between the substrate stack and the electronic component that electrically joins the vertical end surface of the substrate stack and the electronic component,
the junction part including a solder junction part and a resin junction part spaced apart from the solder junction part, the solder junction part being between the substrate side line connection part and the electronic component side line connection part, and the resin junction part being between the vertical end surface of one of the two substrates of the substrate stack and a surface of the electronic component spaced apart from the electronic component side line connection part.

2. The display device according to claim 1, wherein the substrate side line connection part is connected to the end of the line and formed along the vertical end surface, and the substrate side line connection part is a connection pad formed of a conductive material.

3. The display device according to claim 1, wherein the substrate side line connection part is a portion of the end of the line that is exposed in a space between the two substrates.

4. The display device according to claim 1, wherein the electronic component side line connection part has a vertical length that is larger than the substrate side line connection part.

5. The display device according to claim 1, wherein the solder junction part has a thickness that is equal to less than about 20 μm.

6. The display device according to claim 1, wherein a distance between adjacent substrate side line connection parts has a range of 10 to 100 μm.

7. The display device according to claim 1, wherein at least one of the substrate side line connection part and the electronic component side line connection part includes tin (Sn), lead (Pb), zinc (Zn), silver (Ag), or copper (Cu).

8. A display system, comprising:
a first display device;
a second display device adjacent to the first display device along a first direction; and
a third display device adjacent to the first display device along a second direction,
wherein at least one of the first to third display devices includes:
a substrate stack including two substrates, a line between the two substrates, and a substrate side line connection part at an end of the line;
an electronic component including an electronic component side line connection part, the electronic component side line connection part facing a vertical end surface of the substrate stack; and
a junction part between the substrate stack and the electronic component that electrically joins the vertical end surface of the substrate stack and the electronic component,
the junction part including a solder junction part and a resin junction part spaced apart from the solder junction part, the solder junction part being between the substrate side line connection part and the electronic component side line connection part, and the resin junction part being between the vertical end surface of one of the two substrates of the substrate stack and a surface of the electronic component spaced apart from the electronic component side line connection part.

9. The display system according to claim 8, wherein the solder junction part and the resin junction part are arranged in an alternating manner within the junction part.

10. The display system according to claim 9, wherein the substrate side line connection part is connected to the end of the line and formed along the vertical end surface, and the substrate side line connection part is a connection pad formed of a conductive material.

11. The display system according to claim 9, wherein the substrate side line connection part is a portion of the end of the line that is exposed in a space between the two substrates.

12. The display device according to claim 1, wherein the solder junction part and the resin junction part are arranged in an alternating manner within the junction part.

* * * * *

UNITED STATES PATENT AND TRADEMARK OFFICE
CERTIFICATE OF CORRECTION

PATENT NO. : 10,451,934 B2
APPLICATION NO. : 15/717760
DATED : October 22, 2019
INVENTOR(S) : Kaoru Furuta Page 1 of 1

It is certified that error appears in the above-identified patent and that said Letters Patent is hereby corrected as shown below:

In the Claims

Column 14, Line 46:
"10. The display system according to claim 9, wherein the"
Should be:
--10. The display system according to claim 8, wherein the--.

Column 14, Line 51:
"11. The display system according to claim 9, wherein the"
Should be:
--11. The display system according to claim 8, wherein the--.

Signed and Sealed this
Twenty-fifth Day of August, 2020

Andrei Iancu
*Director of the United States Patent and Trademark Office*